United States Patent [19]
Taguchi et al.

[11] Patent Number: 5,241,271
[45] Date of Patent: Aug. 31, 1993

[54] ULTRA-FAST IMAGING METHOD AND APPARATUS

[75] Inventors: Jun'ichi Taguchi; Koichi Sano, both of Yokohama; Tetsuo Yokoyama, Tokyo, all of Japan

[73] Assignee: Hitachi, Ltd., Tokyo, Japan

[21] Appl. No.: 751,970

[22] Filed: Aug. 29, 1991

[30] Foreign Application Priority Data

Aug. 29, 1990 [JP] Japan ................................ 2-225042

[51] Int. Cl.⁵ ............................................ G01R 33/20
[52] U.S. Cl. .................................................... 324/309
[58] Field of Search ............... 324/300, 307, 306, 309, 324/318, 319, 320, 322; 128/653.2, 653.5

[56] References Cited

U.S. PATENT DOCUMENTS 4,859,946  8/1989  Kuhara ................ 324/309
4,916,395  4/1990  Usui .................... 324/307
4,999,581  3/1991  Satoh .................. 324/309

Primary Examiner—Michael J. Tokar
Attorney, Agent, or Firm—Antonelli, Terry, Stout & Kraus

[57] ABSTRACT

A magnetic resonance imaging apparatus selects a partial region of a slice in a subject with a radio frequency magnetic field and generates echo signals only from the partial region. The echo signals are collected from the subject by using an ultra-high speed data acquisition technique. An image of a partial region is reconstructed from the echo signals.

12 Claims, 11 Drawing Sheets

ULTRA-FAST IMAGING METHOD AND APPARATUS

BACKGROUND OF THE INVENTION

This invention relates to an ultra-fast imaging method and apparatus.

Conventionally, ultra-fast data acquisition has been discussed in the following references:

(1) Japanese Journal of Magnetic Resonance in Medicine, Vol. 7, No. 2(1987), pp. 3-24

(2) Magnetic Resonance in Medicine, Vol. 10(1989), pp. 227-240

The reference (1) discusses generally ultra-fast data acquisition systems and explains in Paragraph 2 methods of reducing the number of times of measurement. It introduces various methods of obtaining at an ultra-high speed a single image. All the data required for reconstruction are acquired at once in the ultra-fast data acquisition. The data corresponds to those of k-space. Each of methods for ultra-fast data acquisition in the reference (1) are different from how to trace their own k-trajectory on which the data are put. If all the data of k-trajectory necessary for reconstruction cannot be obtained at once, ultra-fast data acquisition cannot be made but the reference suggests to carry out acquisition dividedly to obtain necessary k-trajectory.

The reference (2) discloses an example of actual ultra-fast data acquisition, and illustrates the result of ultra-fast data acquisition by the use of a sequence which is a kind of an echo-planar method using pulse gradient fields referred to as "BEST". Unlike the reference (1), the reference (2) teaches various innovations on hardwares such as the technique of keeping homogeneity of an electrostatic magnetic field necessary for practical ultra-fast data acquisition, counter-measures for eddy currents in an RF coil by means of switching of gradient magnetic fields, and so forth, and discloses the result of practical data acquisition of the abdomen and the heat and imaging of the data acquired.

To obtain a sufficiently wide image by executing practically such ultra-fast data acquisition, various hardware limitations are imposed on an imaging apparatus. The dimension of the region which can be measured in ultra-fast data acquisition depends on the intensity of a readout gradient magnetic field as a vibrating magnetic field, on a switching speed (a synchronization speed of vibration) in the imaging apparatus, the resolution of the image and sequence for generating magnetic resonance signals. Therefore, the imaging apparatus becomes more expensive. The imaging apparatuses which have gained a wide application at present and which repeat acquisition for one region are not provided with hardwares necessary for obtaining a sufficiently wide region in ultra-fast data acquisition or in other words, a readout gradient field generator equipped with a sufficient intensity and a sufficient switching speed.

Another prior art reference related with the present invention is JP-A-63-105748. This reference discloses a spin-echo method which measures only the region which is desired to be visualized. This spin-echo method effects, for example, 90° slice selection by a first RF pulse, phase-inverts by 180° the slice crossing the former slice by a second RF pulse and images the crossing regions.

SUMMARY OF THE INVENTION

It is therefore an object of the present invention to provide a method capable of ultra-fast data acquisition without imposing severe conditions on an imaging apparatus.

It is another object of the present invention to provide an economical ultra-fast imaging apparatus.

It is still another object of the present invention to provide a method which conducts ultra-fast data acquisition using an imaging apparatus which has been used widely at present and which repeats acquisition for one region without substantially changing its hardware.

It is still another object of the present invention to provide a method for ultra-fast data acquisition without aliasing which appears in the case where an improper region, i.e. a wider region than a proper region for an ultra-fast imaging apparatus, is imaged.

To accomplish these objects, the present invention limits beforehand the region to be measured to a small region and executes the sequence of ultra-fast data acquisition for such a small region. The size and shape of the region from which all data required for reconstruction are acquired by one shot are determined from the limitations such as the gradient field intensity, the switching time, the transverse relaxation time of magnetization, etc, in the imaging apparatus.

DESCRIPTION OF THE PREFERRED EMBODIMENTS

Figure 2:
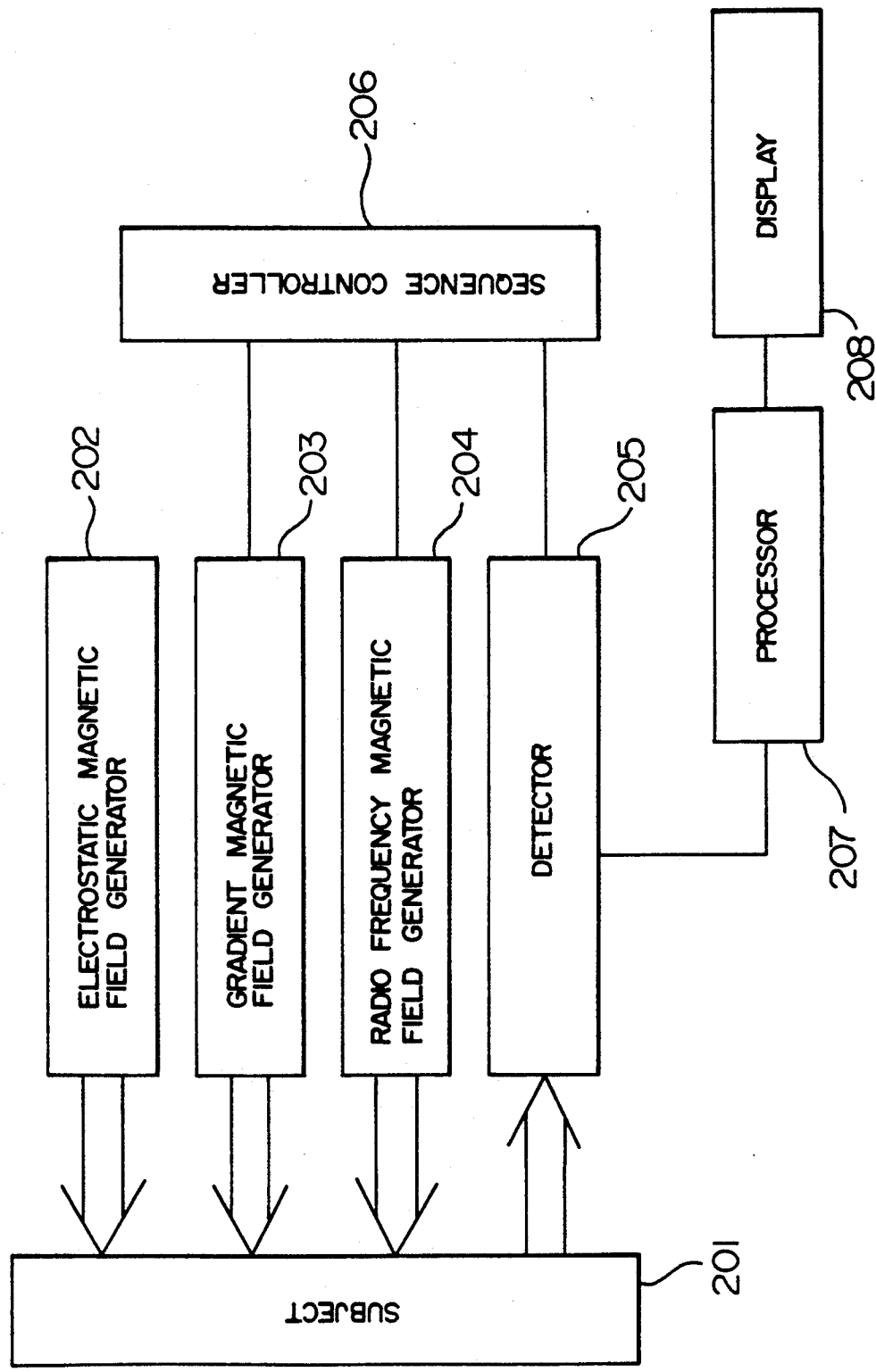
FIG. 2 is a structural block diagram of an imaging apparatus of the embodiment of the present invention.

Hereinafter, the structure of a magnetic resonance inspection apparatus for practising the present invention will be explained with reference to FIG. 2.

A subject 201 is placed in an electrostatic magnetic field generated by an electrostatic magnetic field generator 202. Various operations for obtaining a sectional image of the subject 201 are carried out by a sequence controller 206. The sequence controller 206 controls a gradient magnetic field generator 203, a radio frequency magnetic field generator 204 and a detector 205. The gradient magnetic field generator 203 plays the role of providing the difference of magnetic fields depending on positions to the subject 201 and the radio frequency magnetic field generator 204 plays the role of changing the direction of magnetization that oscillates at a frequency within a certain range. The detector 205 measures the electromagnetic wave emitted by magnetization inside the inspection subject 201, that is, a magnetic resonance signal, and delivers the measured data to a processor 207. The processor 207 stores the measured data. At this point, the data are aligned in k-space. Then, the processor subjects the data to a reconstruction such as Fourier transform (data manipulation) and generates those data which directly correspond to the image in a real space. The data are stored in the processor 207 or in an external memory, not shown, and are displayed on a display 208, such as a CRT.

The present embodiment relates to a data acquisition method of the subject and to the mode of operations of each device by the sequence controller 206. More definitely, the sequence controller 206 creates a program describing the procedure for issuing a command to each device and stores such a program. The operation of each device corresponds to the execution of an operation which has a certain predetermined significance to the subject 201. For this reason, the following description will deal primarily with the operations having any significance to the subject 201 instead of describing the operation itself of each device. For example, "a 90° slice selection operation in a Z direction" is achieved by operating the gradient field magnetic generator 203 to generate a gradient magnetic field in the Z direction and at the same time, applying an RF pulse in the intensity such that magnetization is selected and excited at 90°.

Figure 1:
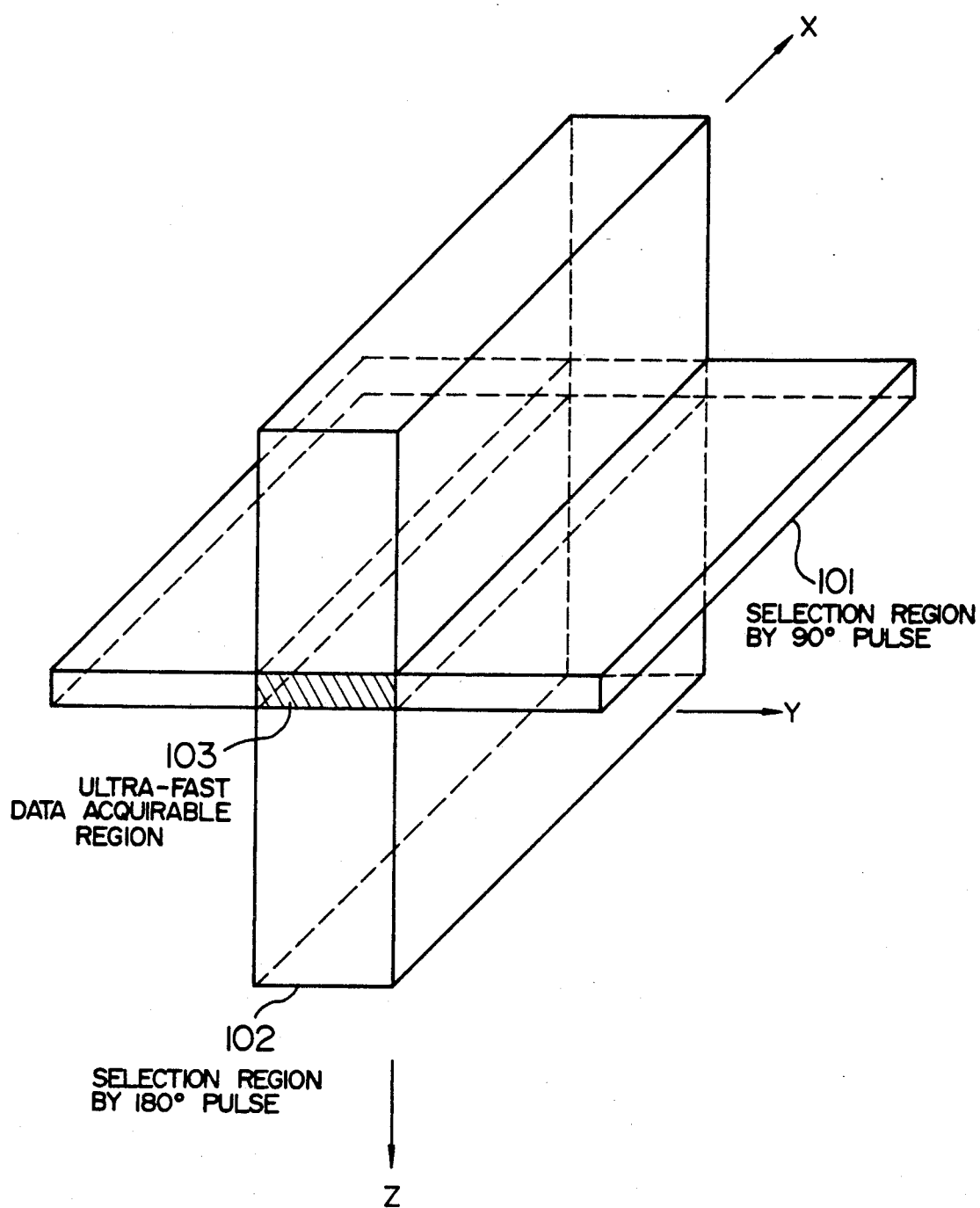
FIG. 1 shows a selection method of a region which is to be imaged in an embodiment of the present invention.

Next, an embodiment of the present invention in the simplest form will be explained with reference to FIG. 1.

Here, the description will be given about the case where ultra-fast data acquisition of a partial region of the subject 201 is conducted as the simplest case.

In this embodiment, slice selection is made by a 90° pulse and a slice crossing orthogonally the slice selection plane of the 90° pulse is selectively subjected to phase reversion by a 180° pulse in accordance with the technique disclosed in JP-A-63-105748. In this case, a region at which the selection region 101 by the 90° pulse and the selection region 102 by the 180° pulse cross one another is a data acquisition region. Therefore, the selection region 101 by the 90° pulse and the selection region 102 by the 180° pulse are selected so that this data acquisition region becomes a data acquirable region which is determined by the performance of the imaging apparatus and by the imaging sequence. The region of intersection becomes an ultra-fast data acquirable partial region 103 and data of this region are acquired at an ultra-high speed.

Figure 3:
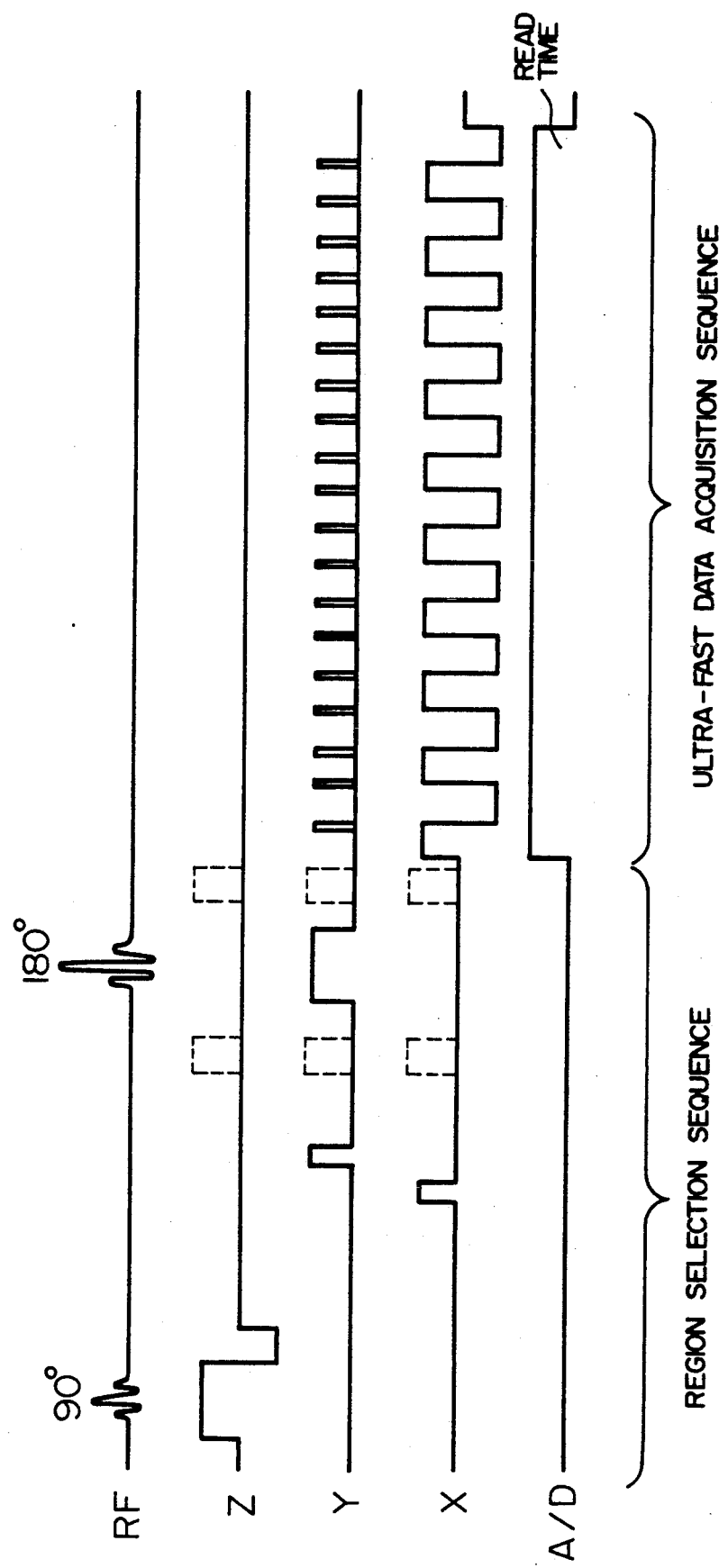
FIG. 3 shows its sequence.

Various ultra-fast data acquisition methods have been proposed in the past as already described with reference to the related prior art, and any of them may be used in the present invention. FIG. 3 shows the sequence of a method using a pulse-like encode magnetic field as an example. This sequence is one of the applications of an Echo-Planar method. The abscissa in this diagram represents the time and the ordinates does the operation of each device.

In this sequence, the former half is the sequence for selecting the region which is to be imaged and the latter half is the sequence for ultra-fast data acquisition.

In the former half, the slice direction is the Z axis for the 90° pulse and the Y axis for the 180° pulse. The pulses represented by dash lines in the diagram are for removing artifacts and they are generated, whenever necessary.

In the latter half, the gradient magnetic field in the readout direction is plotted in the X axis and the gradient magnetic field in the encode direction, in the Y axis. While the positive and negative gradient magnetic fields in the readout direction are applied alternately, the gradient magnetic field in the encode direction is applied in the pulse form between these gradient magnetic fields. A predetermined quantity of the magnetic field in the encode direction is applied between the 90° pulse and the 180° pulse. In this embodiment, the application quantity is about the half of the application quantity of the gradient magnetic field applied at the readout portion 301. The echo-planar method or a spiral scan method can be used, too, as the ultra-fast data acquisition method.

The following description will clarify that the ultra-fast data acquirable region is determined by the performance of the imaging apparatus and the data acquisition sequence. In ultra-fast data acquisition, it is the maximum gradient magnetic field intensity and the rise time that determines the dimension of the ultra-fast data acquisition region, as the apparatus condition. If the data acquisition sequence is set as shown in FIG. 3, for example, how many times the gradient magnetic field can be turned ON and OFF is determined by the apparatus condition provided that the total read time and image resolution in the X direction are determined, as will be represented by the formula given in the following paragraph.

To obtain resolution $\Delta x$ in the X direction when the maximum gradient magnetic field intensity is $G_{max}$, one measuring time $\tau$ is $1/(r \cdot G_{max} \cdot \Delta x)$ with r representing a gyromagnetic rotation ratio. It is 4,258 rounds/Gauss in the case of a hydrogen nucleus. To turn ON/OFF once the gradient magnetic field, the time $\tau + 2\Delta t$ is necessary with $\Delta t$ representing the rise time. If the total read time is T, the number of times n of ON/OFF of the gradient magnetic field in the X direction is given by $T/(\tau + 2\Delta t)$ if fractions are omitted. Resolution in the Y direction is determined by the sum of the application quantities of the gradient magnetic fields applied in the pulse form (i.e. gradient field intensity x application time). The visual field is given by $\Delta y \cdot n$ with $\Delta y$ being resolution in the Y direction. Accordingly, the visual field in the Y direction is $\Delta y \cdot n$ and that in the X direction is determined by a sampling rate employed at the time of measurement. A large visual field can be obtained by making the sampling rate sufficiently small. Therefore, though a sufficiently large region can be secured in the X direction as the ultra-fast data acquirable region, only the region $\Delta y \cdot n$ can be obtained in the Y direction. If $G_{max} = 0.3$ Gauss/cm and $\Delta x = 0.2$ cm, for example, $\tau$ is 4 msec and if $\Delta t = 1$ msec, the time necessary for turning ON/OFF once is $\tau = 6$ msec. If the total measuring time is 96 msec, ON/OFF can be made only 16 times, and if resolution in the Y direction is 0.2 cm, the visual field in the Y direction that can be secured is only 3.2 cm. In contrast, since the visual field in the X direction is equivalent to the visual field at the time of ordinary data acquisition, a visual field of 40 cm, for example, can be secured. This means that the ultra-fast data acquirable region is a thinly elongated sheet-like region of 3.2 cm × 40 cm. This region is partially selected in accordance with the known methods and ultra-fast data acquisition is made for this region.

Figure 4:
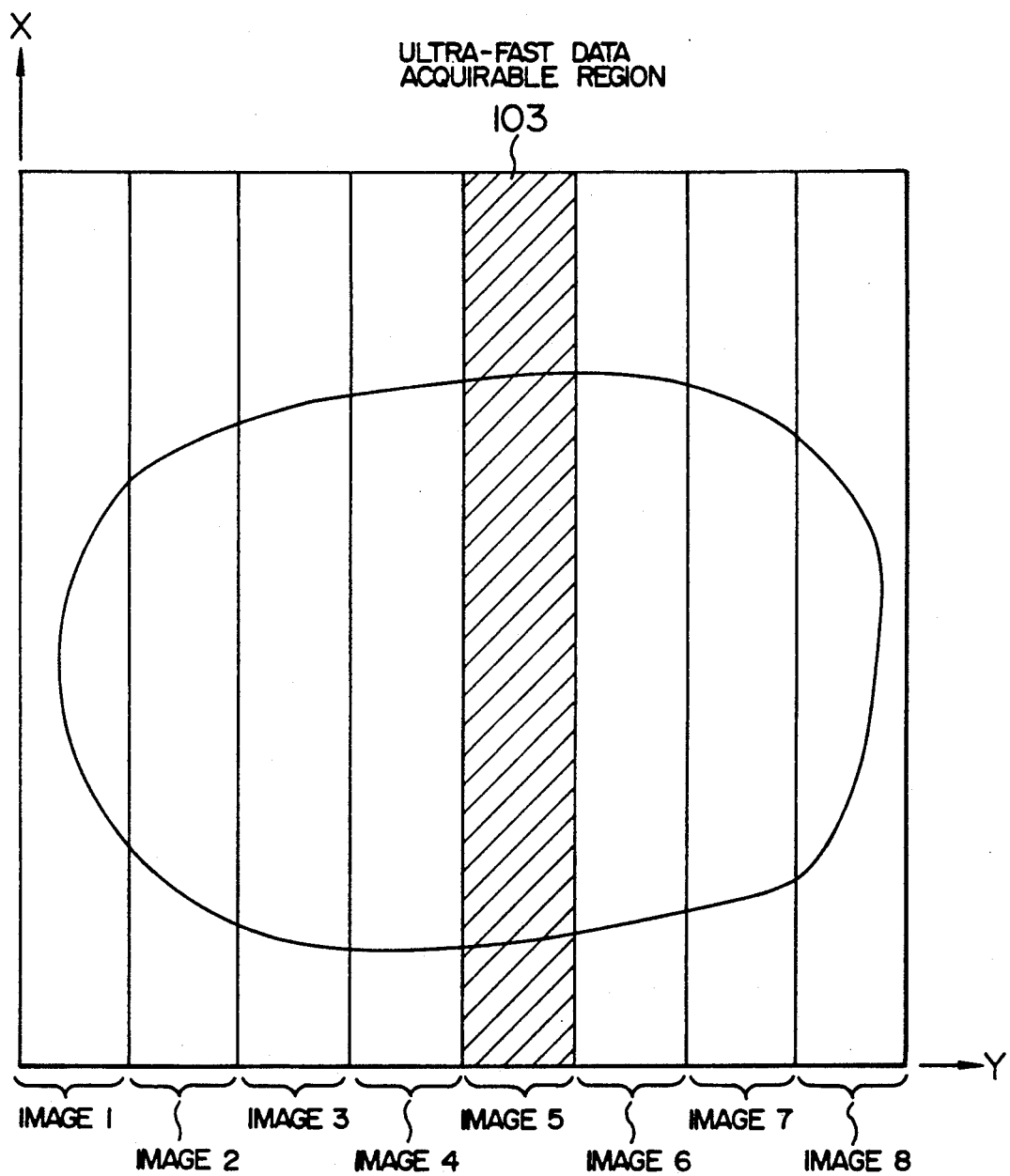
FIG. 4 shows another embodiment of the present invention which displays spatially continuously the images of selected regions.

Next, the second embodiment of the present invention will be explained with reference to FIG. 4. It will be hereby assumed that the region the data of which are to be acquired is sufficiently greater than the ultra-fast data acquirable region 103 and needs several regions of the latter. More definitely, the drawing shows the case where eight ultra-fast data acquirable partial regions 103 are required. In this case, the space of the ultra-fast data acquirable partial region 103 is used as one image and plurality of these partial regions are aligned without any spatial gap in such a manner as to cover entirely the region the data of which are to be acquired. The data of each image is sequentially acquired at an ultra-high speed in the same way as in the first embodiment. The order of data acquisition is not particularly limitative but is arbitrary.

Figure 5:
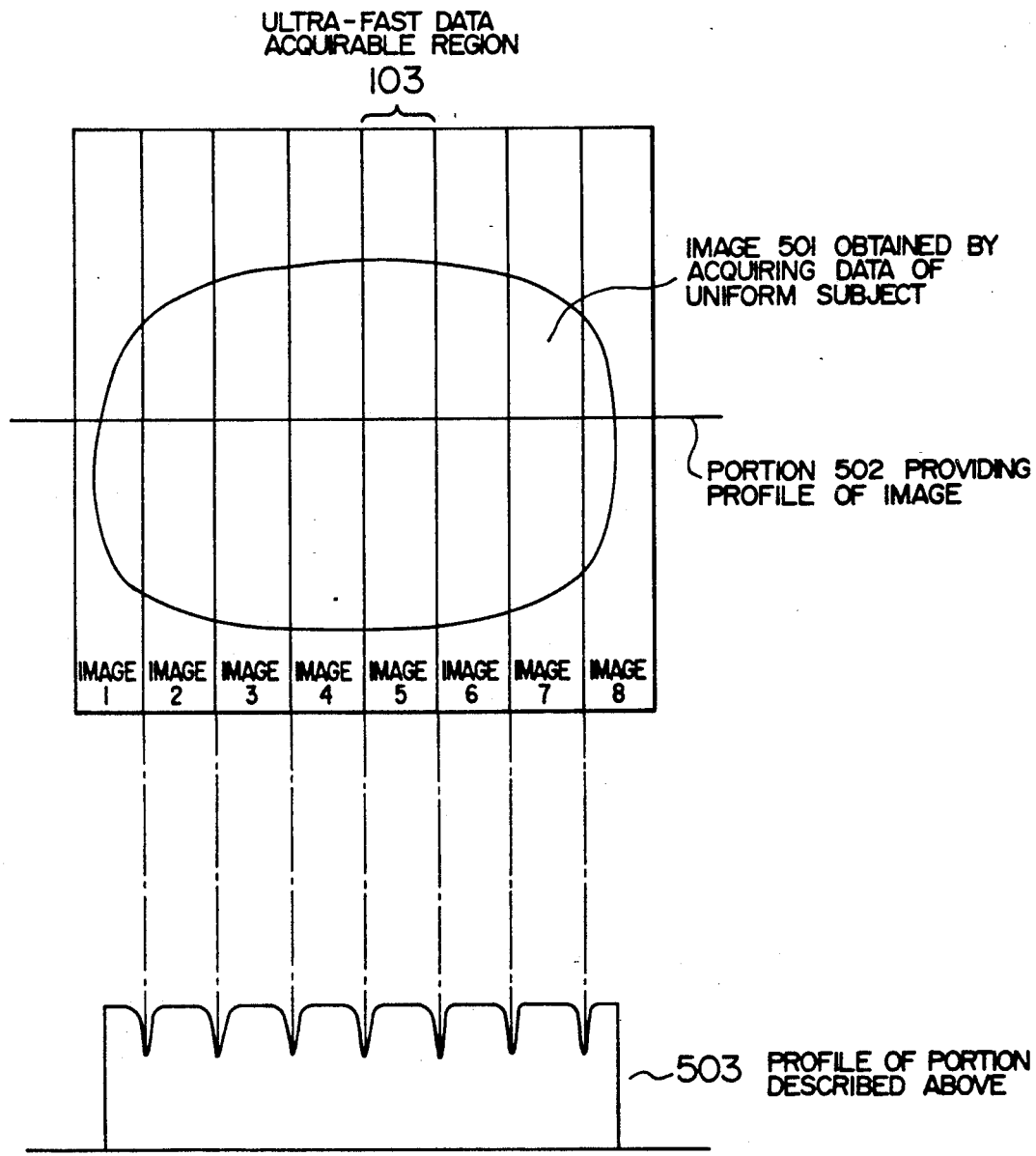
FIG. 5 shows the profile of the image of each region displayed in FIG. 4.

Since the 90° pulse of each slice excites the same slice in this case, the time interval for acquiring the data of each image must be set to approximately the spin-lattice relaxation time of magnetization of the subject. Generally, this spin-lattice relaxation time is about 1 second. Therefore, the data acquisition time interval of each slice is set to about 1 second, too. However, since the data acquisition time for one image is from about 100 msec to about 200 msec, there occurs the problem that the major proportion of the time is a waiting time for data acquisition of the next image. Though the ultra-fast data acquirable partial regions 103 are shown aligned without gaps in FIG. 4, it is not possible practically to slice and select each partial region in exactly the rectangular form during the practical data acquisition, and the excitation intensity drops near the slice. When excitation is made beyond the ultra-fast data acquirable partial region 103, artifacts will be induced due to so-called "aliasing". For this reason, slicing is generally reduced to such an extent as not to induce the artifacts due to aliasing. Then, the resulting image of the ultra-fast data acquirable partial region 103 is dim around its peripheral portions and bright at the center. When data acquisition of a uniform subject is made, therefore, an image 501 of the uniform subject can be obtained as shown in FIG. 5. When a profile representing the density value of the image is taken along a certain line, the profile of a line 502 providing the profile of the image in FIG. 5 should originally be a rectangle because data acquisition of the uniform subject is made, but is comb-shaped as a whole as represented by the profile 503 because the density drops at both ends of each image.

Figure 6:
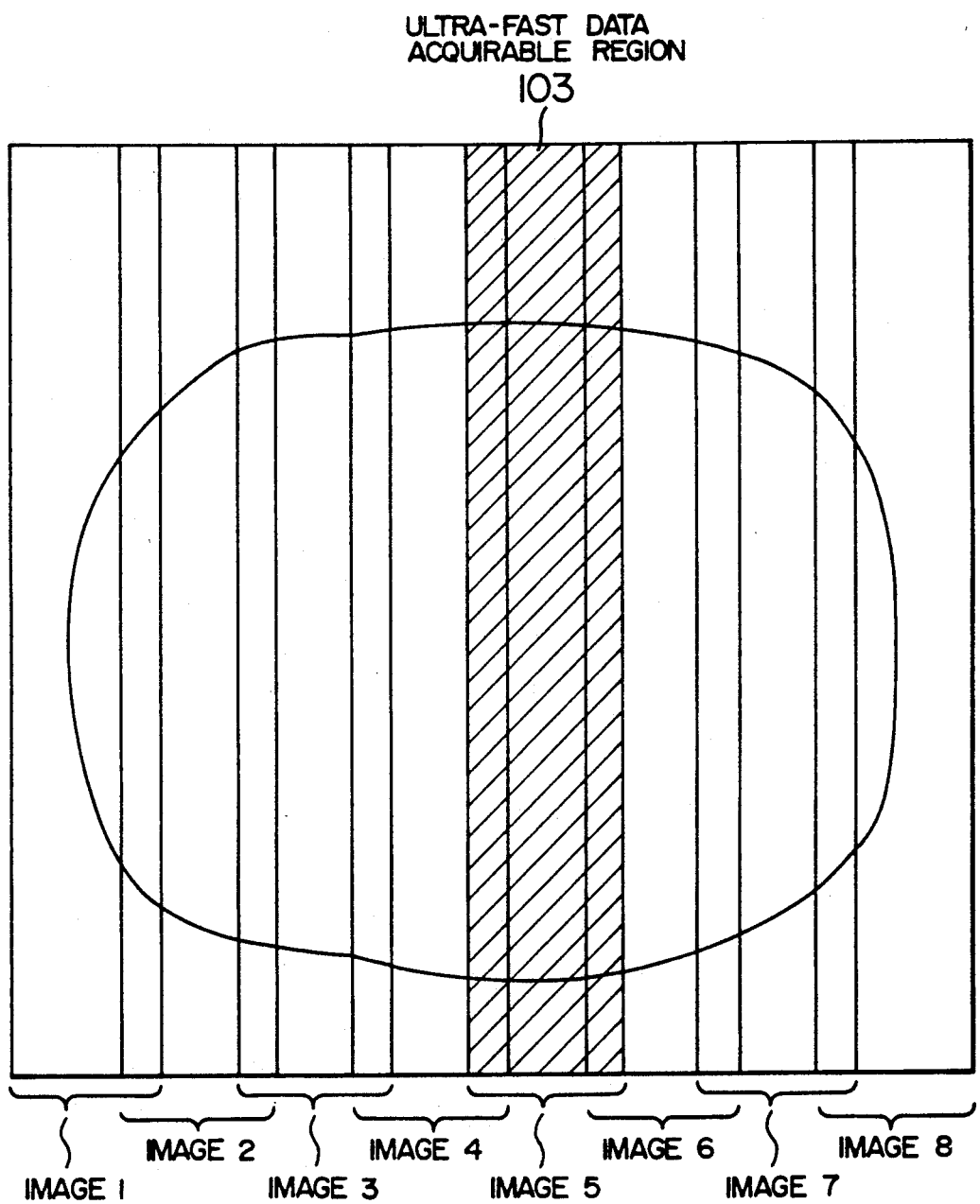
FIG. 6 shows still another embodiment of the present invention which displays spatially continuously the images of selected regions while overlapping them partially.

To eliminate such a problem, there is a method which overlaps the images of the ultra-fast data acquirable regions 103 as shown in FIG. 6 and continues the portions at which the density at the center of each image is normally expressed, to obtain one large image.

However, each image exists on the same plane. Therefore, even if the method described above is employed, the time before the entire image is obtained is limited by the spin-lattice relaxation time of magnetization of the subject because the selection plane of the 90° pulse or that of the 180° pulse is the same. Thus, there is yet left the problem that the data acquisition time is long because the time corresponding substantially to the spin-lattice relaxation time must be waited for before the next data can be obtained.

The third embodiment of the present invention for reducing the data acquisition time will be therefore explained with reference to FIG. 7.

Figure 7:
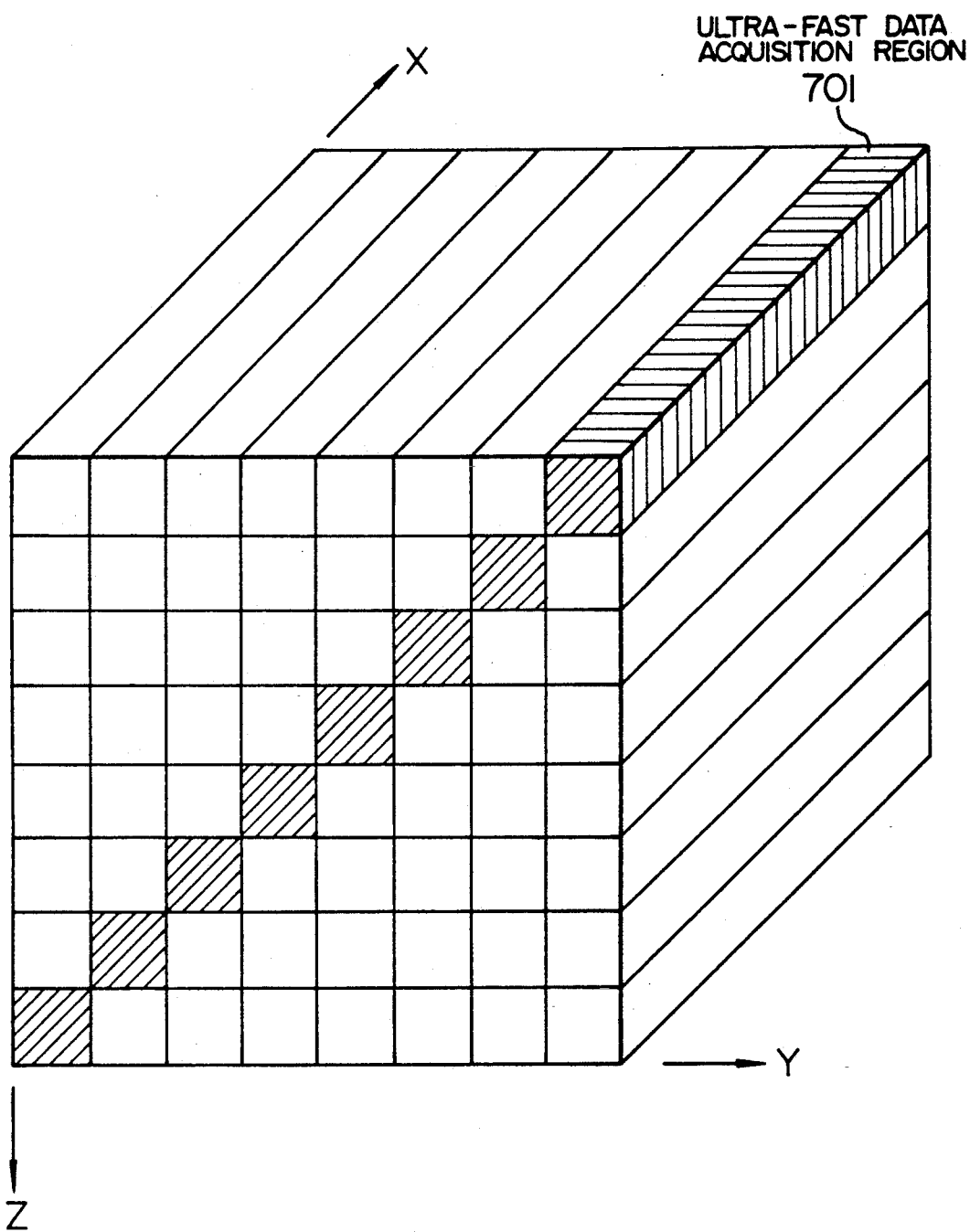
FIGS. 7 to 11 show data acquisition order of spatially continuous regions.

Each of the hatched blocks in FIG. 7 is hereby dealt with as the ultra-fast data acquisition region 701. Since the vertical and horizontal planes of each block are different, a next block is not affected by magnetization of a preceding block. Therefore, it is not necessary to wait for the relaxation of magnetization of the subject, and the data of the next block can be acquired at an ultra-high speed.

Figure 8:
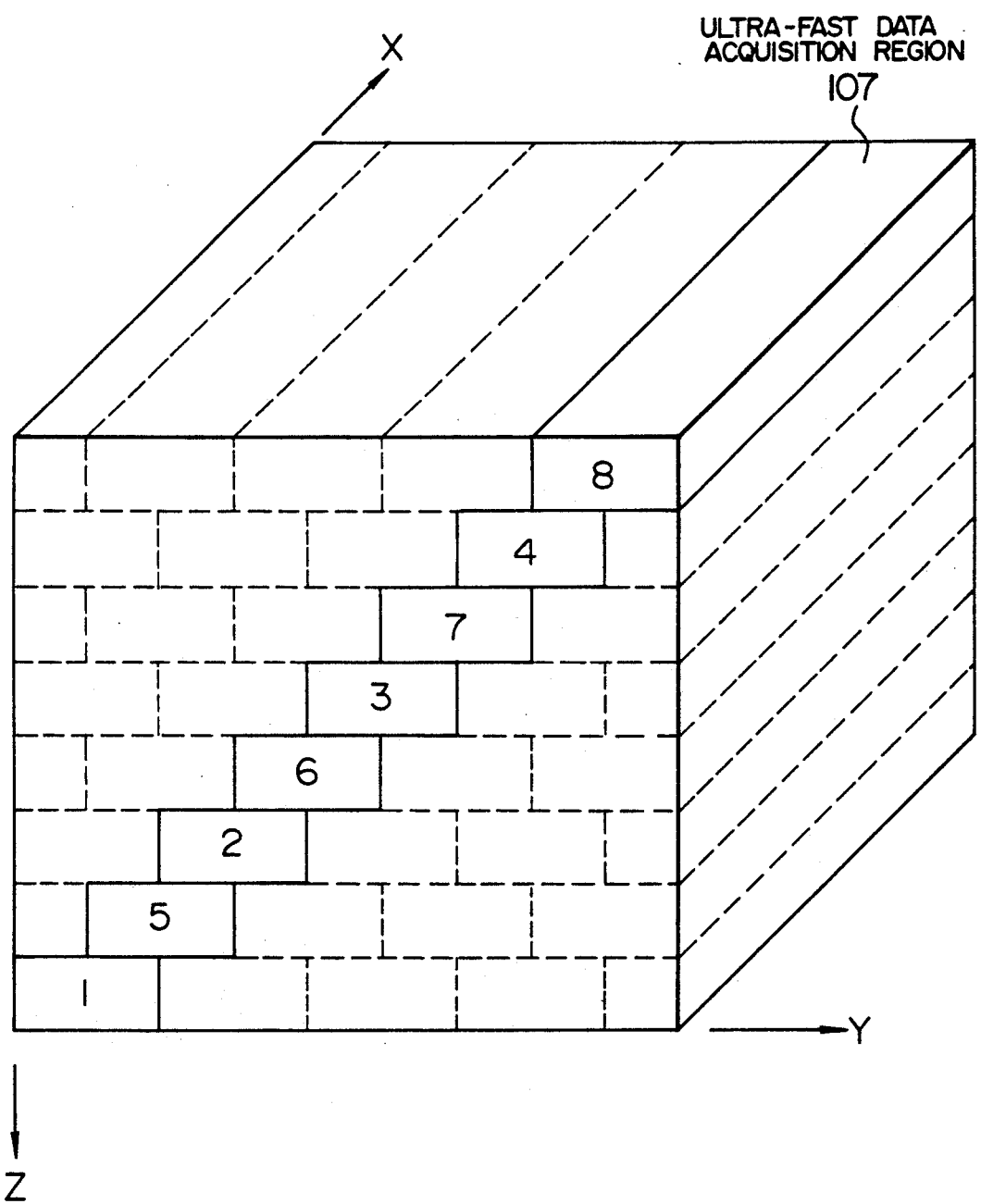

When the ultra-fast data acquisition blocks are assorted as shown in FIG. 8 and their data are acquired every other blocks or at intervals of several blocks as represented by numerals in the drawing, the influences of ultra-fast data acquisition of the block on a next block immediately thereafter can be avoided.

In FIG. 8, in the case where the fifth data acquisition block represented by numeral 5 is to be measured, for example, the z-direction slice of the fifth block overlaps z-direction slices of the first and second blocks to which first and second data acquisition are executed respectively. The z-direction slice of the fifth block does not overlap those of the third and fourth blocks. Therefore, waiting time till the data acquisition of the next block is set so that time interval between the acquisition for the second block and the acquisition for the fifth block corresponds substantially to the relaxation time of magnetization. In this case, it is only necessary that magnetization relaxes before the third block from now on is measured. Accordingly, the same quantity of data can be acquired at a rate of three times that of the second embodiment given above.

Figure 9:
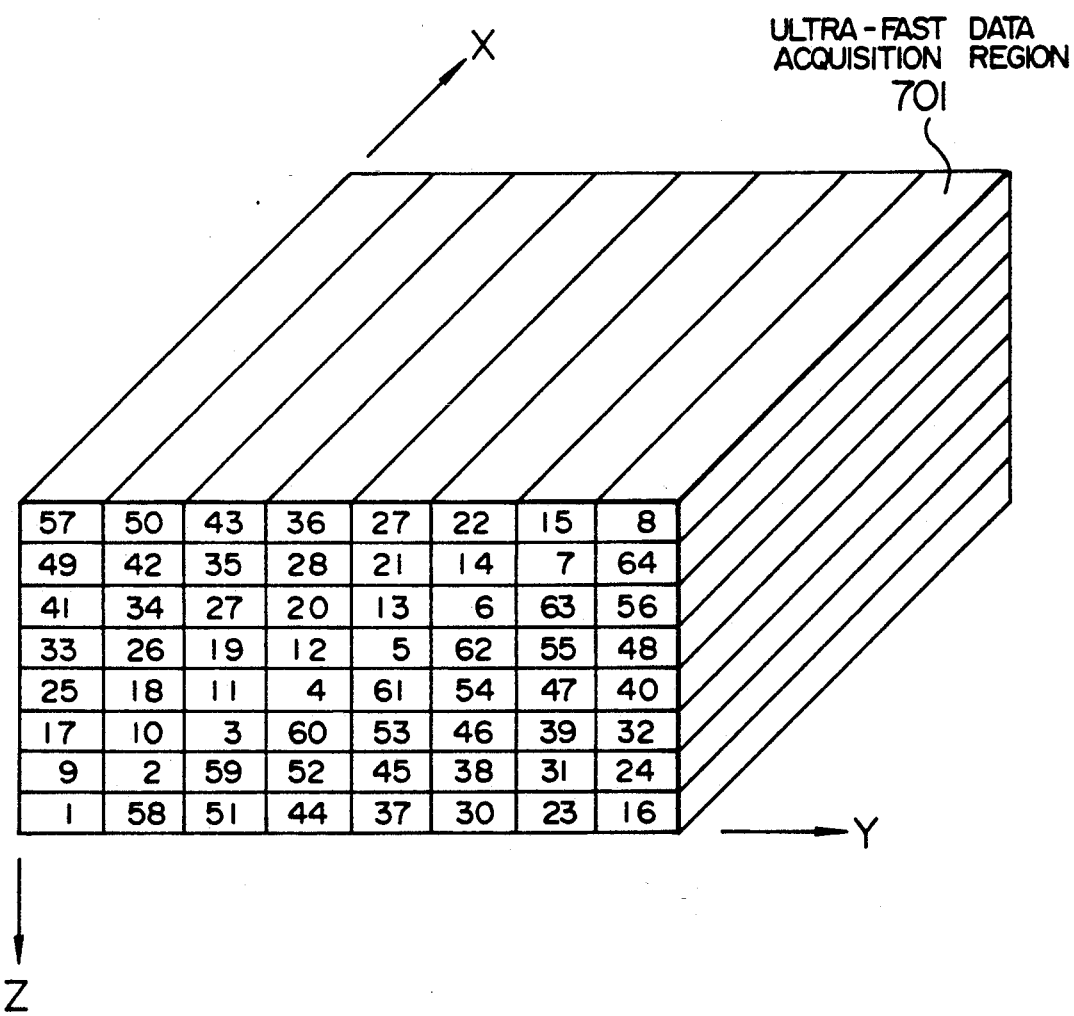

Next, the fourth embodiment of the present invention will be explained with reference to FIG. 9. This embodiment assumes the acquisition of three-dimensional data. FIG. 9 shows the case where the regions to be measured are divided into 64 blocks and each of the blocks is the ultra-fast data acquisition region 701. As can be anticipated from the third embodiment given above, data acquisition of each of the blocks is made at an ultra-high speed in the order represented by numerals in FIG. 9. If measurement is made in this way as in the third embodiment, the slice selection plane of each RF pulse is different between a preceding block and a succeeding block and the influences of data acquisition of the preceding block does not act on the next block. In this case, data acquisition of the first block affects only data acquisition of the ninth block. Therefore, the waiting time for data acquisition of the next block is adjusted so that magnetization of the subject sufficiently relaxes in the interim. Generally, the time required for magnetic imaging is from 100 to 200 msec and even if the waiting time is 0 in this case, the period of time from data acquisition of the first block till data acquisition of the ninth block on which the influences of the former appear is from about 800 to about 1,600 msec. This value corresponds substantially to the spin-echo relaxation time and is substantially sufficient as the waiting time.

Figure 10:
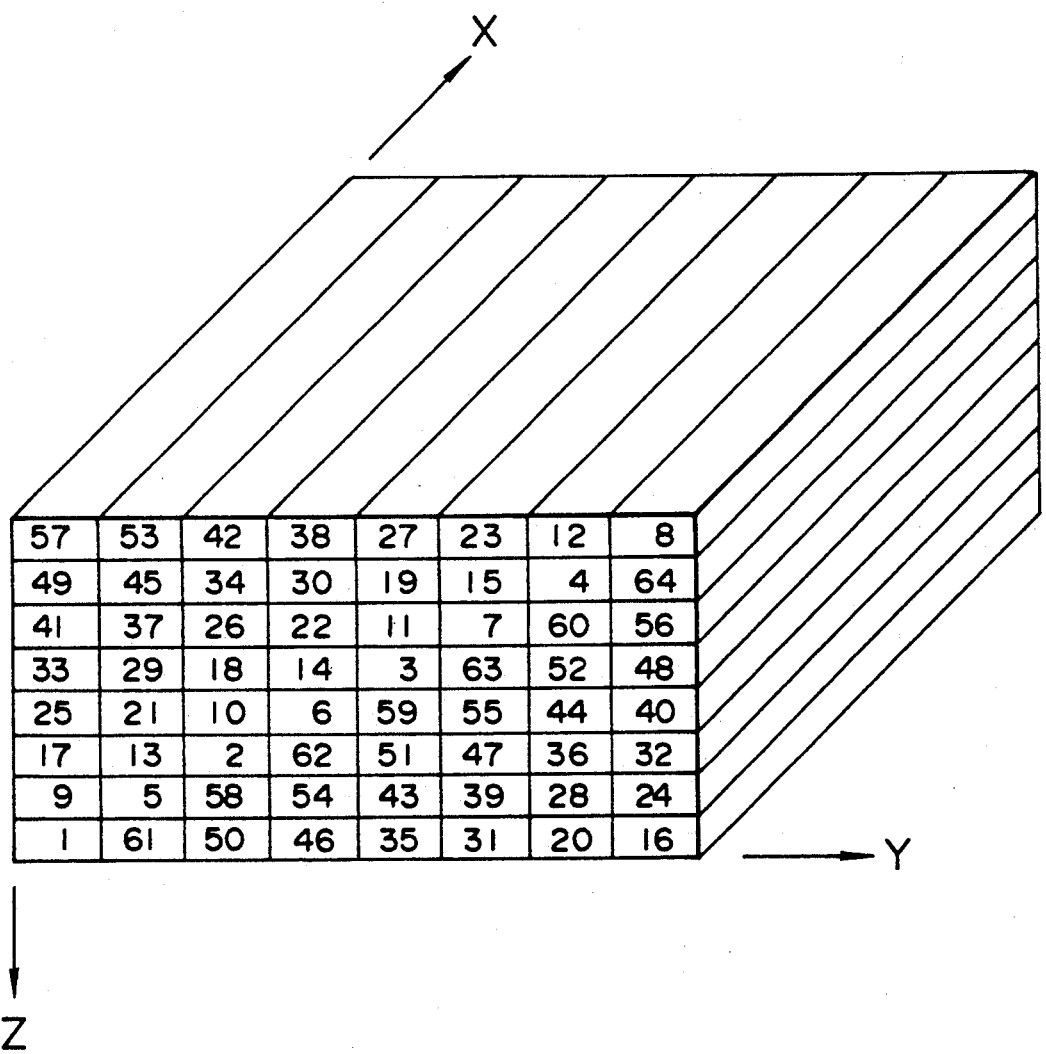

The data acquisition order of each block needs not always be the same as the order represented by the numerals in FIG. 9, and it may be effected every other blocks as in the order represented by the numerals in FIG. 10 or in other different orders.

Figure 11:
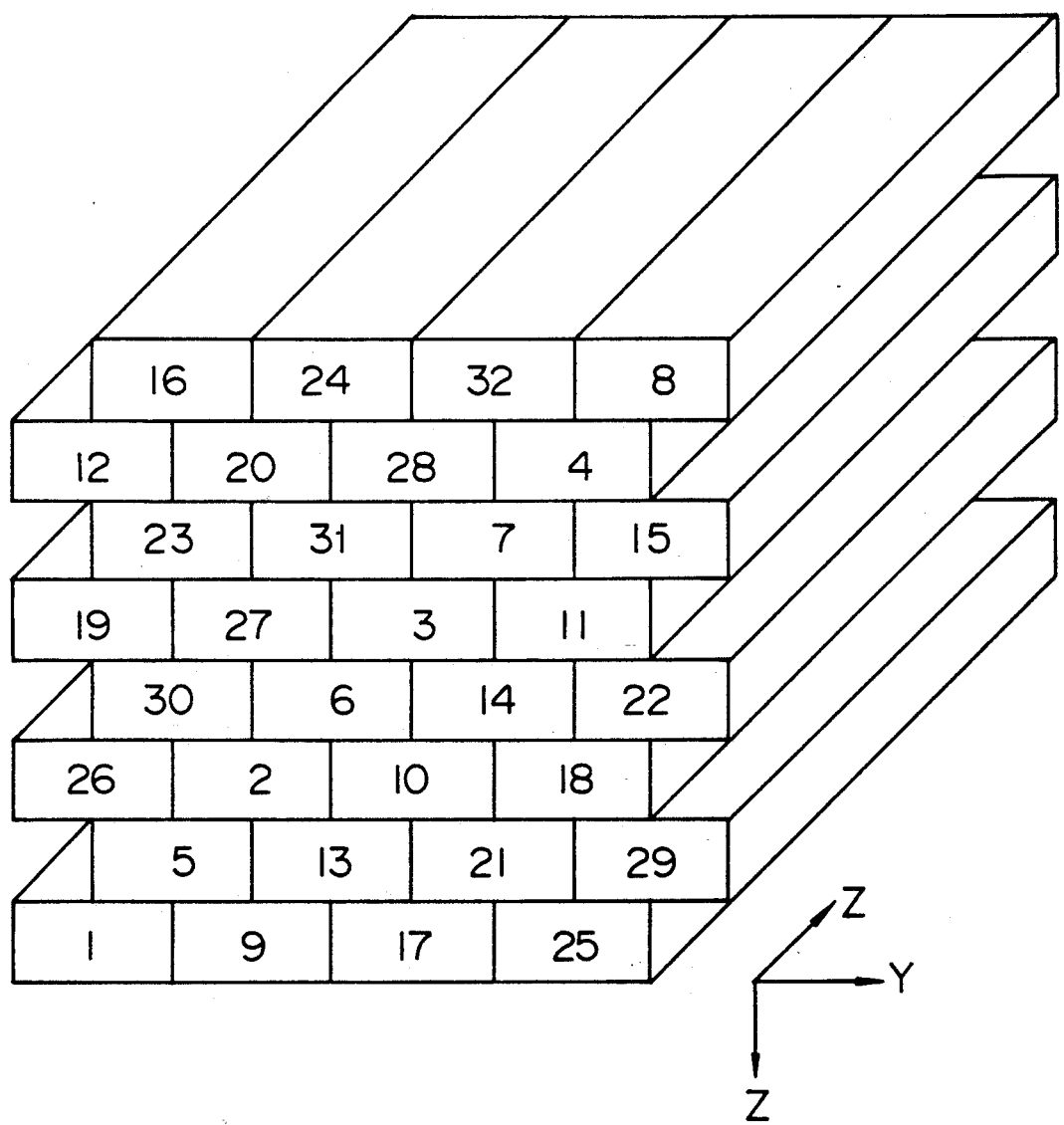

The block assortment needs not always be the same as those shown in FIGS. 9 and 10, either, but may be the assortment shown in FIG. 11 or each block may somewhat overlap with others.

Though the direction of the region of the ultra-fast data acquisition of the subject is arbitrary, the encode direction and readout direction of the ultra-fast data acquisition region provide somewhat different images depending on their directions because of non-uniformity of the magnetic fields, because of the chemical shift, because of the blood flow, and so forth. Therefore, diagnostic problems occur very often and it is difficult in some cases to distinguish artifacts from real images. If the images having different directions of axes are compared with one another by exchanging the directions of axes of the encode direction and readout direction or by measuring the data while changing the polarity or in the direction to which rotation is applied, the artifacts can be distinguished more easily from the real images in most cases.

It would be therefore convenient if these images can be simultaneously observed or one image can be switched to another for observation by operating a button. This holds true not only of the images obtained by ultra-fast data acquisition but also of ordinary images.

In comparison with the image formed from the data measured for the ordinary time, the image obtained by connecting a large number of images obtained from the partial regions measured at an ultra-high speed in accordance with the present invention has a shorter data acquisition time, but has seams and a low signal-to-noise ratio (S/N) of the image itself. Accordingly, one of the utilization methods of the present invention is the one which acquires the data at an ultra-high speed by utilizing the ultra-fast data acquisition performance of the present invention, obtains the images from the data, changes sequentially the imaging positions so as to search a suspected diseased part, and effects data acquisition and imaging after the measuring portion is thus specified.

The present invention provides the effect that ultra-fast data acquisition can be made, for the partial region, by use of a magnetic resonance inspection apparatus.

We claim:

1. An imaging method for imaging a partial region of a slice in a subject at an ultra-high speed by utilizing magnetic resonance, comprising the steps of:
   generating an electrostatic magnetic field;
   generating a first gradient magnetic field;
   generating a second gradient magnetic field in a direction substantially perpendicular to said first gradient magnetic field;
   generating a third gradient magnetic field in a direction substantially perpendicular to said first and second gradient magnetic fields;
   generating a radio frequency magnetic field;
   selecting the partial region of the slice in the subject by exciting and rotating spins in the subject with the radio frequency magnetic field and at least one of the gradient magnetic fields to re-phase the excited spins in the partial region of the slice and generate echo signals only from the partial region;
   collecting the echo signals from said subject by using an ultra-high speed data acquisition; and
   reconstructing the image of the partial region from the echo signals.

2. An imaging method according to claim 1, wherein the size of the partial region to be imaged is varied in accordance with the resolution of said image, the intensity of said gradient magnetic field and a sequence for generating echo signals at an ultra-high speed.

3. An imaging method according to claim 1, wherein said echo signals are caused by the vibration of at least one of said gradient magnetic fields.

4. An imaging method according to claim 3, wherein said echo signals are encoded by generating at least one of said gradient magnetic fields in pulse form.

5. An imaging method according to claim 1, wherein selection of said partial region to be imaged is accomplished by generating a 90° radio frequency magnetic field simultaneously with the generation of said first gradient magnetic field and subsequently generating a 180° radio frequency magnetic field simultaneously with the generation of said second gradient magnetic field.

6. An imaging method according to claim 1, which further comprises the step of:
   executing each of said steps repeatedly while changing said partial region to be imaged.

7. An imaging method according to claim 6, wherein said partial regions are spatially continuous.

8. An imaging method according to claim 7, wherein the images of said partial regions which are continuous spatially are displayed simultaneously.

9. An imaging method according to claim 7, wherein said partial regions overlap.

10. An imaging method according to claim 1, which further comprises at least one of the following steps of:
    exchanging the direction of each of said gradient magnetic fields;
    changing the polarity of at least one of the gradient magnetic fields; and
    applying rotation to the directions of said gradient magnetic fields.

11. An imaging apparatus for imaging a partial region of a slice in a subject at an ultra-high speed by utilizing magnetic resonance, comprising:
    means for generating an electrostatic magnetic field;
    means for generating a first gradient magnetic field;
    means for generating a second gradient magnetic field in a direction substantially perpendicular to said first gradient magnetic field;
    means for generating a third gradient magnetic field in a direction substantially perpendicular to said first and second gradient magnetic fields;
    means for generating a radio frequency magnetic field;
    means for selecting the partial region of the slice in a subject by exciting and rotating spins in the subject with the radio frequency magnetic field and at least one of the gradient magnetic fields to re-phase the excited spins in the partial region of the slide and generate echo signals only from the partial region;
    means for collecting the echo from said subject by using an ultra-high speed data acquisition; and
    means for reconstructing the image of the partial region from the echo signals.

12. An imaging apparatus according to claim 11, wherein at least one of the three of said gradient magnetic fields is vibrating.

* * * * *